(12) United States Patent
Ohl et al.

(10) Patent No.: US 10,948,732 B2
(45) Date of Patent: Mar. 16, 2021

(54) LIGHT-EMITTING UNIT AND METHOD FOR PRODUCING A LIGHT-EMITTING UNIT

(71) Applicant: Robert Bosch GmbH, Stuttgart (DE)

(72) Inventors: Christian Ohl, Pfullingen (DE); Florian Grabmaier, Tübingen (DE); Balazs Jatekos, Budapest (HU); Benno Roesener, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 137 days.

(21) Appl. No.: 16/309,522

(22) PCT Filed: Jul. 5, 2017

(86) PCT No.: PCT/EP2017/066828
§ 371 (c)(1),
(2) Date: Dec. 13, 2018

(87) PCT Pub. No.: WO2018/011039
PCT Pub. Date: Jan. 18, 2018

(65) Prior Publication Data
US 2019/0212571 A1 Jul. 11, 2019

(30) Foreign Application Priority Data
Jul. 15, 2016 (DE) .......................... 102016213001.3

(51) Int. Cl.
*G02B 26/08* (2006.01)
*G02B 26/10* (2006.01)
(Continued)

(52) U.S. Cl.
CPC ..... *G02B 27/0983* (2013.01); *G02B 26/0833* (2013.01); *G02B 26/101* (2013.01);
(Continued)

(58) Field of Classification Search
CPC .............. G02B 27/0983; G02B 26/101; G02B 26/0833; G02B 26/105; G02B 19/0023;
(Continued)

(56) References Cited

U.S. PATENT DOCUMENTS 6,002,507 A 12/1999 Floyd et al.
6,014,240 A 1/2000 Floyd et al.
(Continued)

FOREIGN PATENT DOCUMENTS

CN 1779502 A 5/2006
EP 1225469 A2 7/2002

OTHER PUBLICATIONS

International Search Report for PCT/EP2017/066828, dated Oct. 2, 2017.

*Primary Examiner* — Mustak Choudhury
(74) *Attorney, Agent, or Firm* — Norton Rose Fulbright US LLP; Gerard Messina

(57) ABSTRACT

A light-emitting unit, comprising a substrate and a light-emitting device, which is situated on the substrate (2) and is designed to emit a laser beam. A swiveling light-deflecting device is situated on the substrate. A capping device is situated on the substrate and covers the light-emitting device and the light-deflecting device, the capping device having a first cap section and a transparent second cap section. The first cap section is designed to redirect the laser beam emitted by the light-emitting device onto the light-deflecting device. The light-deflecting device is designed to deflect the redirected laser beam in such a way that deflected laser beam is able to exit through second cap section.

9 Claims, 1 Drawing Sheet

(51) Int. Cl.

| | | |
|---|---|---|
| *G02B 26/12* | (2006.01) | |
| *G02B 27/09* | (2006.01) | |
| *H01S 5/00* | (2006.01) | |
| *H04N 1/113* | (2006.01) | |
| *H01S 5/022* | (2021.01) | |
| *G02B 19/00* | (2006.01) | |
| *H01S 5/02208* | (2021.01) | |

(52) U.S. Cl.
CPC .......... *G02B 26/105* (2013.01); *H01S 5/0071* (2013.01); *H01S 5/02292* (2013.01); *H04N 1/113* (2013.01); *G02B 19/0023* (2013.01); *G02B 19/0052* (2013.01); *H01S 5/02208* (2013.01)

(58) Field of Classification Search
CPC . G02B 19/0052; H04N 1/113; H01S 5/02292; H01S 5/02208
USPC ...................................................... 359/214.1
See application file for complete search history.

(56) References Cited

U.S. PATENT DOCUMENTS

| | | | |
|---|---|---|---|
| 6,257,491 B1 * | 7/2001 | Tan | G06K 7/10574 |
| | | | 235/462.36 |
| 2003/0231664 A1 | 12/2003 | Geske | |
| 2006/0104065 A1 * | 5/2006 | Lee | H04N 9/315 |
| | | | 362/341 |
| 2013/0231664 A1 | 9/2013 | Balanev et al. | |

* cited by examiner

LIGHT-EMITTING UNIT AND METHOD FOR PRODUCING A LIGHT-EMITTING UNIT

FIELD

The present invention relates to a light-emitting unit and a method for producing a light-emitting unit.

BACKGROUND INFORMATION

On account of their compact size and low costs, micro-opto-electro-mechanical systems (MOEMS) are popular components of sensors, bar code scanners, vehicle headlights or copiers. Thus a MOEMS laser scanner is described in European Patent EP 1 225 469 A2, in which laser light is deflected by a swiveling mirror and a surrounding area may thereby be scanned.

Since in many areas of application, increasingly more sensors are installed in the smallest spaces, there is a continuous demand for even more compact and robust MOEMS components.

SUMMARY

The present invention relates to a light-emitting unit and a method for producing a light-emitting unit.

According to a first aspect, the present invention thus relates to a MOEMS light-emitting unit having a substrate and a light-emitting device situated on the substrate, which is designed to emit a laser beam. A swiveling light-deflecting device is situated on the substrate. Furthermore, a capping device is situated on the substrate, which covers the light-emitting device and the light-deflecting device, the capping device having a reflective first cap section and a transparent second cap section. The first cap section is designed to redirect the laser beam emitted by the light-emitting device onto the light-deflecting device. The light-deflecting device is furthermore designed to deflect the redirected laser beam in such a way that the deflected laser beam is able to exit through the second cap section.

The term "transparent" is here understood in such a way that the second cap section is at least partially transparent or translucent for a wavelength of the laser beam.

According to a second aspect, the present invention relates to a method for producing a light-transmitting unit, a light-transmitting device being disposed on a substrate and a swiveling light-deflecting device being disposed on the substrate. Furthermore, a capping device is situated on the substrate, which covers the light-emitting device and the light-deflecting device. The capping device has a reflective first cap section and a transparent second cap section, the first cap section being designed to redirect a laser beam emitted by the light-emitting device onto the light-deflecting device, and the light-deflecting device being further designed to deflect the redirected laser beam in such a way that the deflected laser beam is able to exit through the second cap section.

Preferred specific embodiments of the present invention are described herein.

The present invention provides a particularly compact light-emitting unit because it is possible to integrate the light-emitting device and the light-deflecting device in a space-saving manner in the substrate. The light-emitting device is preferably positioned in immediate proximity of the swiveling light-deflecting device in order to reduce the dimensions of the light-emitting unit even further. The capping device preferably made of plastic may be produced cost-effectively and is characterized by its robustness.

The redirection of the emitted laser beam is achieved by the capping device itself so that no additional redirecting mirrors are required. This eliminates a corresponding production effort as well as the costs for redirecting mirrors, it being possible to reduce further the size of the light-emitting unit. Since sensitive mirror are no longer required, the integration of the light redirection in the capping device is able to ensure a high robustness of the redirection.

Due to the very low thickness and adjustment tolerances achievable in wafer technology, it is possible to position the light-emitting device, the light-deflecting device and the capping device with respect to one another in such a way that an additional optical calibration or adjustment of the light-emitting unit may be omitted and that the light-emitting unit is therefore more user-friendly.

According to a preferred specific embodiment of the present invention, the cap encloses a cavity that is closed in an airtight manner, in which the light-deflecting device and the light-emitting device are situated. This protects the light-emitting device and the light-deflecting device during production as well as in operation against contamination and damage.

According to a particularly preferred specific embodiment of the light-emitting unit, the light-deflecting device has a swiveling micromirror, a surface of the swiveling micromirror in a rest position being disposed perpendicularly with respect to a light emission direction of the light-emitting device. The term "rest position" is here understood as a non-deflected or non-swiveled position of the micromirror. The light emission direction corresponds to an optical axis of the light-emitting device.

According to this specific embodiment, the surfaces of the light-emitting device and the light-deflecting device in the rest position are preferably each situated on the substrate or integrated into the substrate so as to be parallel with respect to the surface of the substrate. This makes it possible to achieve a low profile of the light-emitting unit.

According to a preferred development of the light-emitting unit, the first cap section is designed to collimate the first laser beam. The laser beam, which is generally emitted at a certain opening angle, is thereby redirected in such a way that individual light beams of the laser beam run parallel to one another. As a result, the light-emitting unit emits very precise laser beams having low scattering without requiring additional lens systems. This both reduces the installation space requirement and improves the precision of the light-emitting unit.

According to another specific embodiment of the light-emitting unit, the first cap section has a parabolic mirror.

According to a particularly preferred specific embodiment of the light-emitting unit, a side of the first cap section facing the light-emitting device has a reflective coating. Such a coating is producible in a more cost-effective manner and allows for higher precision than is achievable when disposing redirecting mirrors on the substrate.

According to one development of the light-emitting unit, the light-emitting device is situated in a cavity in the substrate, the light-deflecting device being able to swivel in the cavity. In this instance, the light-emitting unit has a particularly compact design.

According to a preferred development of the light-emitting unit, the light-emitting device is designed as a surface emitter.

According to another specific embodiment of the method of the present invention, a reflective coating is developed on a side of the first cap section facing the light-emitting device.

DETAILED DESCRIPTION OF EXAMPLE EMBODIMENTS

The numbering of method steps is used for clarity and generally is not intended to imply a specific sequence in time. In particular, it is also possible to carry out multiple method steps at the same time. Various specific embodiments may be combined with one another as desired, if doing so is useful.

Figure 1:
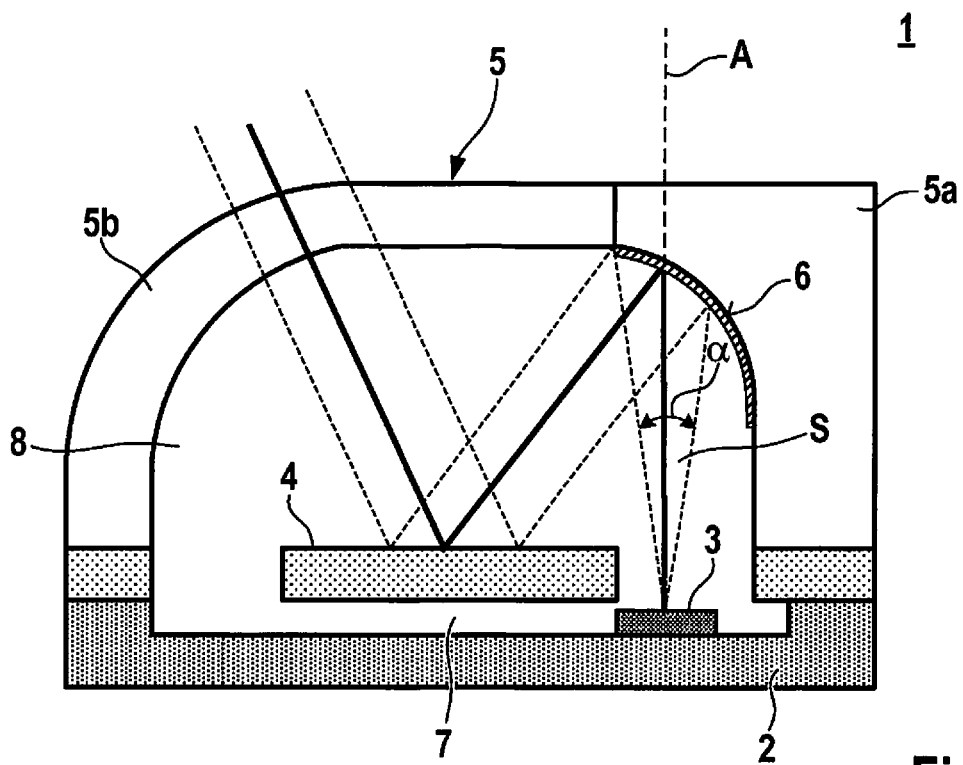
FIG. 1 shows a schematic cross-sectional view of a light-emitting unit according to one specific embodiment of the invention.

FIG. 1 shows a schematic cross-sectional view of a light-emitting unit 1 according to a specific embodiment of the present invention. Light-emitting unit 1 has a substrate 2, preferably made of silicon, in which a cavity 7 is formed. A light-emitting device 3 is situated in cavity 7, which is designed to emit a laser beam S at a specified wavelength along an optical axis A. Optical axis A preferably is perpendicular to a surface of substrate 2. Laser beam S has an opening angle α, that is, it widens over time. The light-emitting unit is preferably a surface emitter (vertical-cavity surface-emitting laser, VCSEL).

Furthermore, a swiveling light-deflecting device 4 is disposed on substrate 2 by suspension elements in such a way that light-deflecting device 4 is able to swivel in cavity 7. Light-deflecting device 4 is preferably a swiveling micromirror or microscanner. The light-deflecting device may be able to swivel about one axis or about two axes. Light-deflecting device 4 may be moved by electromagnetic, electrostatic, thermoelectric or piezoelectric forces. By moving light-deflecting device 4 it is possible to scan a specified solid angle area.

Light-emitting unit 1 furthermore has a capping device 5, which is disposed on substrate 2. Capping device 5 extends across light-emitting device 3 and light-deflecting device 4 so that a cavity 8 is formed between substrate 2 and capping device 5, which encloses light-emitting device 3 and light-deflecting device 4. A vacuum is preferably formed in cavity 8.

Capping device 5 has a reflective first cap section 5a and a transparent second cap section 5b. On a side of capping device 5 facing light-emitting device 3, first cap section 5a has a reflective coating 6, which is designed to redirect the laser beam S emitted by light-emitting device 3 onto light-deflecting device 4. First cap section 5a is designed to be vaulted for this purpose and has the shape of a parabolic mirror or a collimator mirror. The emitted laser beam S having opening angle α is thereby redirected to form a parallel laser beam S.

Light-deflecting device 4 is designed to deflect redirected laser beam S toward second cap section 5b. Second cap section 5b is at least partially transparent for the wavelength of laser beam S so that deflected laser beam S is able to exit through second cap section 5b.

Figure 2:
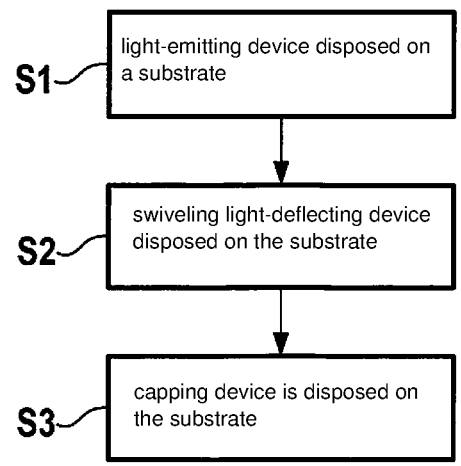
FIG. 2 shows a flow chart of a method for producing a light-emitting unit according to a specific embodiment of the invention.

FIG. 2 shows a flow chart of a method for producing a light-emitting unit 1 according to a specific embodiment of the invention. In a method step S1, a light-emitting device 3 is disposed on a substrate 2. For this purpose, preferably a cavity 7 is formed in substrate 2 in an etching step and light-emitting device 3 is disposed in cavity 7 in the form of a surface emitter or VCSEL.

Furthermore, in a method step S2, a swiveling light-deflecting device 4 is disposed on substrate 2. Light-deflecting device 4 is connected to and fastened on substrate 2 by suspension elements, light-deflecting device 4 being able to swivel in cavity 7. Light-deflecting device 4 is preferably exposed in substrate 2 by etching.

In another method step S3, a capping device 5 is disposed on substrate 2, which covers light-emitting device 3 and light-deflecting device 4. Capping device 5 is preferably made from plastic and is preferably connected to substrate 2 in an airtight manner.

Capping device 5 has a reflective first cap section and a transparent second cap section, first cap section being designed to redirect a laser beam S emitted by light-emitting device 3 onto light-deflecting device 4. Light-deflecting device 4 is furthermore designed to deflect the redirected laser beam S in such a way that deflected laser beam S is able to exit through second cap section 5b.

Preferably, a reflective coating 6 is developed on a side of first cap section 5a facing light-emitting device 3. For example, a silver coating may be vapor-deposited. Capping device 5 may be designed as one piece and be made of the same material.

What is claimed is:

1. A light-emitting unit, comprising:
    a substrate;
    a light-emitting device which is situated on the substrate and is designed to emit a laser beam;
    a swiveling light-deflecting device which is situated on the substrate; and
    a capping device which is situated on the substrate and which covers the light-emitting device and the light-deflecting device, the capping device having a reflective first cap section and a transparent second cap section;
    wherein the first cap section has a parabolic mirror and is configured to redirect the laser beam emitted by the light-emitting device onto the light-deflecting device with no additional mirror present in the light-emitting unit for redirecting the laser beam, and the light-deflecting device is further configured to deflect the redirected laser beam in such a way that the deflected laser beam is able to exit through the second cap section.

2. The light-emitting unit as recited in claim 1, wherein the cap encloses a cavity that is sealed in an airtight manner.

3. The light-emitting unit as recited in claim 1, wherein the light-deflecting device has a swiveling micromirror and a surface of the swiveling micromirror in a rest position is perpendicular to a light emission direction of the light-emitting device.

4. The light-emitting unit as recited in claim 1, wherein the first cap section is configured to collimate the emitted laser beam.

5. The light-emitting unit as recited in claim 1, wherein a side of the first cap section facing light-emitting device has a reflective coating.

6. The light-emitting unit as recited in claim 1, wherein the light-emitting device is situated in a cavity in the substrate, and the light-deflecting device is configured to swivel in the cavity.

7. The light-emitting unit as recited in claim 1, wherein the light-emitting device is designed as a surface emitter.

8. A method for producing a light-emitting unit, comprising:
- disposing a light-emitting device on a substrate;
- disposing a swiveling light-deflecting device on the substrate; and
- disposing a capping device on the substrate, which covers the light-emitting device and the light-deflecting device, the capping device having a reflective first cap section and a transparent second cap section, the first cap section having a parabolic mirror and being configured to redirect the laser beam emitted by the light-emitting device onto the light-deflecting device with no additional mirror present in the light-emitting unit for redirecting the laser beam, and the light-deflecting device being further configured to deflect the redirected laser beam in such a way that the deflected laser beam is able to exit through the second cap section.

9. The method as recited in claim 8, wherein a reflective coating is developed on a side of the first cap section facing the light-emitting device.

\* \* \* \* \*